(12) United States Patent
Tanaka

(10) Patent No.: US 8,706,978 B2
(45) Date of Patent: *Apr. 22, 2014

(54) SEMICONDUCTOR STORAGE DEVICE HAVING NONVOLATILE FLASH AND RAM WITH SIMULTANEOUS DATA COPY AND DATA RECEIVE

(71) Applicant: Kabushiki Kaisha Toshiba, Minato-ku (JP)

(72) Inventor: Yoshiyuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,887

(22) Filed: Feb. 6, 2013

(65) Prior Publication Data

US 2013/0145090 A1  Jun. 6, 2013

Related U.S. Application Data

(60) Continuation of application No. 12/945,202, filed on Nov. 12, 2010, now Pat. No. 8,397,035, which is a division of application No. 12/056,688, filed on Mar. 27, 2008, now Pat. No. 7,958,287, which is a continuation of application No. 10/926,141, filed on Aug. 26, 2004, now Pat. No. 7,353,324.

(30) Foreign Application Priority Data

Sep. 29, 2003 (JP) .................................. 2003-338551

(51) Int. Cl.
*G06F 13/00* (2006.01)

(52) U.S. Cl.
USPC ........... 711/154; 711/103; 711/156; 711/172; 713/320; 710/52; 710/66

(58) Field of Classification Search
USPC ................. 711/154, 103, 156, 172; 713/320; 710/52, 66

See application file for complete search history.

(56) References Cited

U.S. PATENT DOCUMENTS

| | | | |
|---|---|---|---|
| 6,052,302 A | 4/2000 | Moyer et al. | |
| 6,363,009 B1 | 3/2002 | Fukuzumi | |
| 6,400,633 B1 | 6/2002 | Al-Shamma et al. | |
| 6,418,506 B1 * | 7/2002 | Pashley et al. | ................ 711/103 |
| 6,438,665 B2 | 8/2002 | Norman | |
| 6,542,411 B2 | 4/2003 | Tanikawa et al. | |
| 6,567,319 B2 | 5/2003 | Sato et al. | |
| 6,725,321 B1 | 4/2004 | Sinclair et al. | |
| 6,741,495 B2 | 5/2004 | Kunikiyo et al. | |
| 6,795,890 B1 * | 9/2004 | Sugai et al. | ................... 711/103 |

(Continued)

FOREIGN PATENT DOCUMENTS

| | | |
|---|---|---|
| JP | 6-52691 | 2/1994 |
| JP | 7-219720 | 8/1995 |
| JP | 7-281842 | 10/1995 |
| JP | 10-124384 | 5/1998 |
| JP | 10-307749 | 11/1998 |
| JP | 11-110283 | 4/1999 |
| JP | 2001-357684 | 12/2001 |
| JP | 2002-175211 | 6/2002 |

*Primary Examiner* — Hong Kim
(74) *Attorney, Agent, or Firm* — Oblon, Spivak, McClelland, Maier & Neustadt, L.L.P.

(57) ABSTRACT

A semiconductor storage device includes a first nonvolatile memory to store user data of a file, a second nonvolatile memory to store management data of the file, the second nonvolatile memory being different in type from the first nonvolatile memory, and a controller to control read/write of data with respect to the first and second nonvolatile memories.

21 Claims, 12 Drawing Sheets

(56) References Cited

U.S. PATENT DOCUMENTS

| | | | |
|---|---|---|---|
| 6,845,438 B1 | 1/2005 | Tanaka et al. | |
| 6,930,536 B2 | 8/2005 | Nazarian et al. | |
| 7,353,324 B2 | 4/2008 | Tanaka | |
| 8,397,035 B2 * | 3/2013 | Tanaka | 711/154 |
| 2004/0105303 A1 * | 6/2004 | Fukuzumi | 365/158 |
| 2004/0193782 A1 * | 9/2004 | Bordui | 711/103 |
| 2005/0128319 A1 | 6/2005 | Morino | |
| 2005/0251617 A1 | 11/2005 | Sinclair et al. | |
| 2006/0034133 A1 | 2/2006 | Sekiguchi et al. | |
| 2006/0171224 A1 | 8/2006 | Nejad et al. | |

* cited by examiner

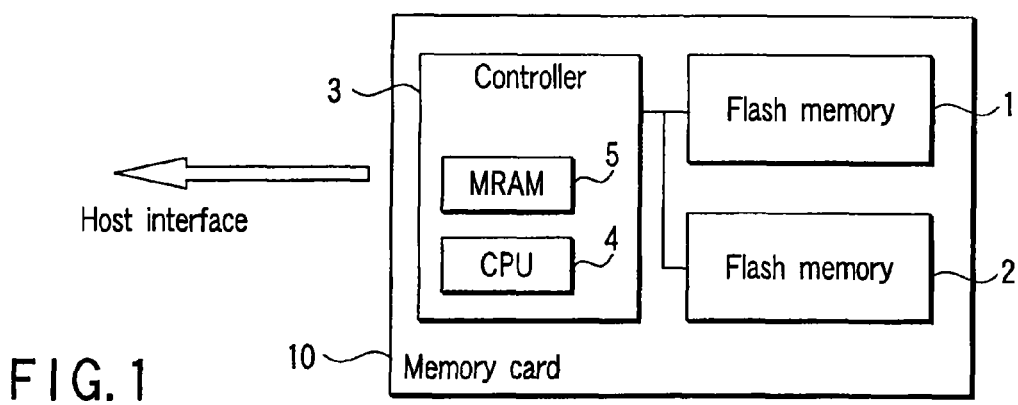
F I G. 1
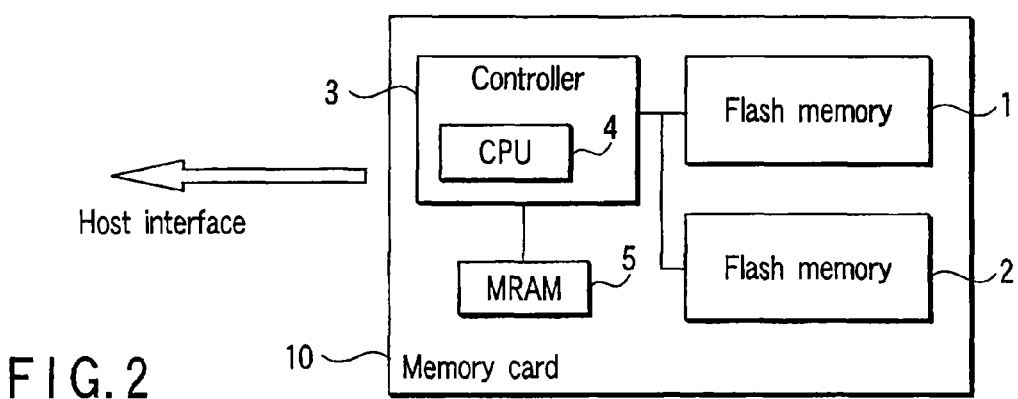
F I G. 2
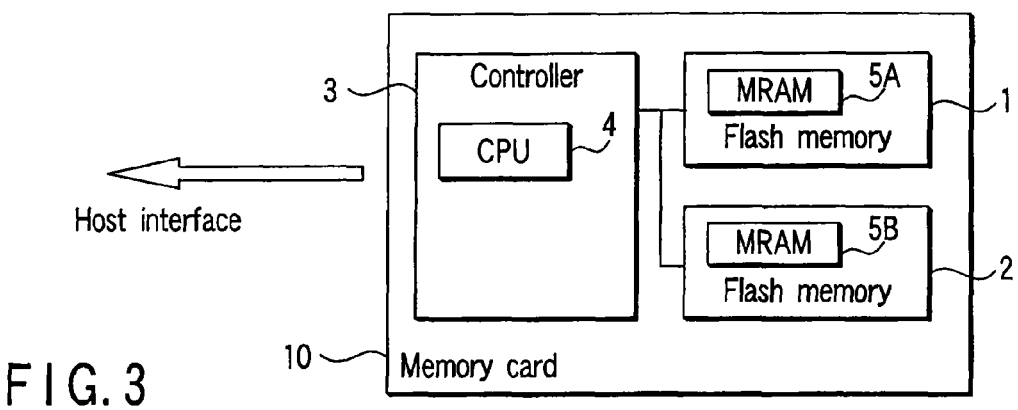
F I G. 3
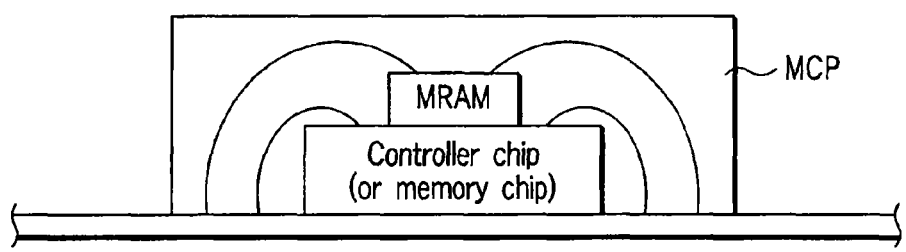
F I G. 4

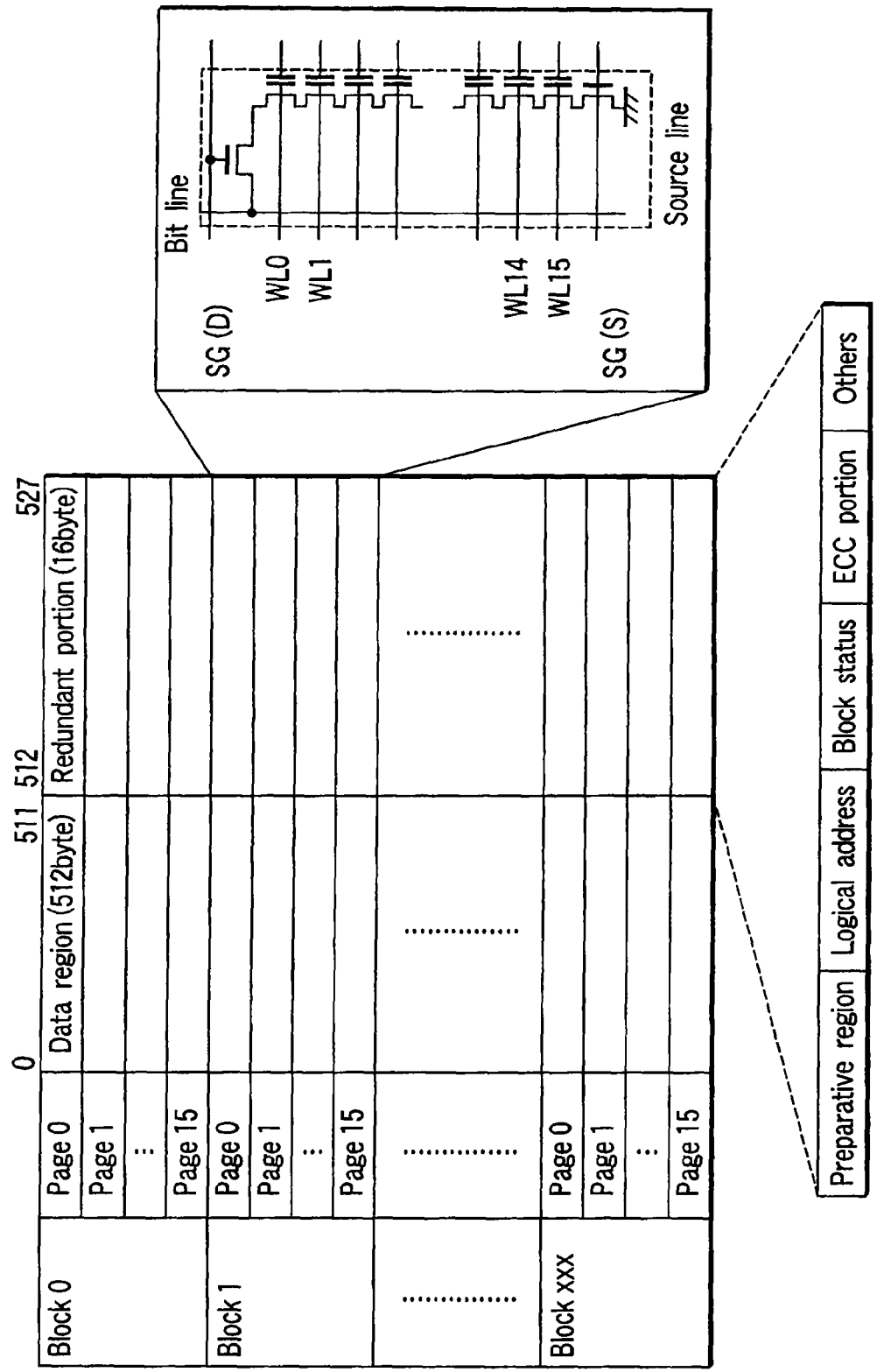
F I G. 5

| Logical sector | 4kb/cluster | 8kb/cluster | | |
|---|---|---|---|---|
| 0 | Master boot | Master boot | | |
| 1 | Vacancy | Vacancy | | |
| 2 | Vacancy | Vacancy | | |
| 3 | Vacancy | Vacancy | | |
| 4 | Vacancy | Vacancy | | |
| 5 | Vacancy | Vacancy | | |
| 6 | Vacancy | Vacancy | | |
| 7 | Vacancy | Vacancy | NAND block | MRAM |
| 8 | Vacancy | Vacancy | Prior art | Present |
| 9 | Vacancy | Vacancy | | embodiment |
| 10 | Vacancy | Vacancy | | |
| 11 | Vacancy | Vacancy | | |
| 12 | Vacancy | Vacancy | | |
| 13 | Vacancy | Vacancy | | |
| 14 | Vacancy | Vacancy | | |
| 15 | Vacancy | Vacancy | | |
| 16 | Vacancy | Vacancy | | |
| 17 | Vacancy | Vacancy | | |
| 18 | Vacancy | Vacancy | | |
| 19 | Boot | Vacancy | | |
| 20 | FAT1 | Vacancy | | |
| 21 | FAT1 | Vacancy | | |
| 22 | FAT1 | Vacancy | NAND block | MRAM |
| 23 | FAT1 | Vacancy | Prior art | Present |
| 24 | FAT1 | Vacancy | | embodiment |
| 25 | FAT1 | Boot | | |
| 26 | FAT2 | FAT1 | | |
| 27 | FAT2 | FAT1 | | |
| 28 | FAT2 | FAT1 | | |
| 29 | FAT2 | FAT2 | | |
| 30 | FAT2 | FAT2 | | |
| 31 | FAT2 | FAT2 | | |
| 32 | Directory | Directory | | |
| 33 | Directory | Directory | | |
| 34 | Directory | Directory | | |
| 35 | Directory | Directory | | |
| 36 | Directory | Directory | | |
| 37 | Directory | Directory | | |
| 38 | Directory | Directory | | |
| 39 | Directory | Directory | NAND block | MRAM |
| 40 | Directory | Directory | Prior art | Present |
| 41 | Directory | Directory | | embodiment |
| 42 | Directory | Directory | | |
| 43 | Directory | Directory | | |
| 44 | Directory | Directory | | |
| 45 | Directory | Directory | | |
| 46 | Directory | Directory | | |
| 47 | Directory | Directory | | |
| 48-63 | 1 cluster | 1 cluster | NAND block | |

FIG. 9

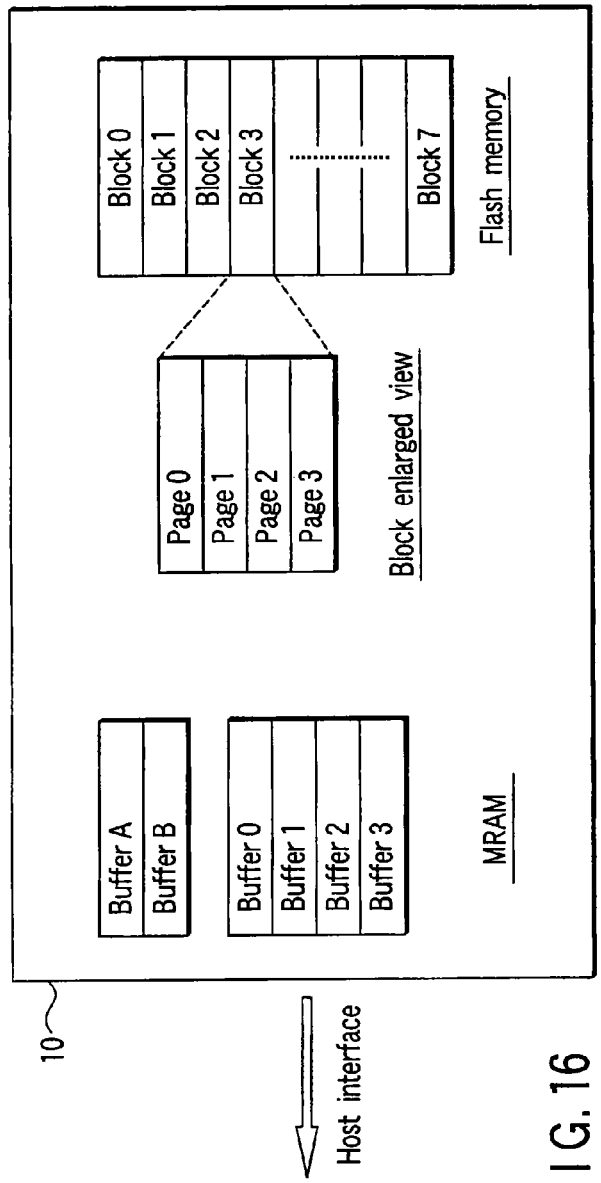

| OFFSET | Upper Byte | Lower Byte |
|---|---|---|
| Word0 (LBA=0) | Physical block address High-order | Physical block address Low-order |
| Word1 (LBA=1) | Physical block address High-order | Physical block address Low-order |
| Word2 (LBA=2) | Physical block address High-order | Physical block address Low-order |
| ..... | | |
| Word498 (LBA=497) | Physical block address High-order | Physical block address Low-order |
| Word499 (LBA=498) | Physical block address High-order | Physical block address Low-order |
| Word500 (LBA=499) | Physical block address High-order | Physical block address Low-order |

F I G. 13

F I G. 16

SEMICONDUCTOR STORAGE DEVICE HAVING NONVOLATILE FLASH AND RAM WITH SIMULTANEOUS DATA COPY AND DATA RECEIVE

This application is a continuation of and claims the benefit of priority under 35 U.S.C. §120 from U.S. application Ser. No. 12/945,202, filed Nov. 12, 2010, which is a Division of U.S. Ser. No. 12/056,688, filed Mar. 27, 2008, now U.S. Pat. No. 7,958,287, which is a Continuation of U.S. application Ser. No. 10/926,141, filed Aug. 26, 2004, now U.S. Pat. No. 7,353,324, and is based upon and claims the benefit of priority under 35 U.S.C. §119 from prior Japanese Patent Application No. 2003-338551, filed Sep. 29, 2003, the entire contents of which are incorporated herein by reference.

BACKGROUND OF THE INVENTION

1. Field of the Invention

The present invention relates to a semiconductor storage device including a nonvolatile memory such as a flash memory.

2. Description of the Related Art

In recent years, a flash memory card using a NAND type flash memory has been used as a storage medium for various types of portable information terminals such as a digital camera.

For the NAND type flash memory, memory cells which are disposed adjacent to each other and which share a drain and source and which are connected in series with each other are regarded as a basic unit (NAND unit). One end of the series connection is connected to a bit line via a select gate (SD(D)) and the other end thereof is connected to a source line via a select gate (SG(S)). An aggregate of the cells connected to the same word line constitutes a page as a basic unit of write or read, and an aggregate of the pages held between the select gate on the side of the bit line and that on the side of the source line constitutes a block.

An erase operation is basically performed by a block unit described above. Therefore, when rewrite occurs with respect to a part of the block, a save operation of copying data that is not to be rewritten to another area is required. A technique of rewrite/erase is described, for example, in Jpn. Pat. Appln. KOKAI Publication No. 6-52691.

Moreover, a physical address on a flash memory in which data of a certain logical address exists is frequently changed. Therefore, it is necessary to prepare a logical address/physical address conversion table required for performing logical address/physical address conversion every time. The conversion table is prepared in the following procedure at the time of power activation. That is, a redundant portion of a top page of each block is searched, and the data of the logical address corresponding to the data stored in the block is confirmed. In this case, a logical address region of the redundant portion is read, and the logical address/physical address conversion table is prepared based on an obtained value. A technique of the logical address/physical address conversion table is described, for example, in Jpn. Pat. Appln. KOKAI Publication No. 10-124384.

Additionally, when a file is updated in a memory card using the NAND type flash memory, the data of a file main body has a relatively large amount of data, and therefore the save operation does not occur so often. However, for data of a file management region such as a file allocation table (FAT), directory, and subdirectory, rewrite by a sector unit occurs with a large frequency. Therefore, there is a problem that the above-described save operation frequently occurs and a file rewrite performance of a flash memory card is deteriorated. Therefore, there is a demand for presentation of a technique for enhancing the rewrite performance of the file.

Moreover, in recent years, there is a tendency for increase of a capacity of the flash memory, and there is a problem that a preparation time (i.e., activation time) of the logical address/physical address conversion table is considerably long. Therefore, there is a demand for the presentation of a technique in which even with the increase of the capacity of the flash memory, the activation time of the conversion table does not increase. Furthermore, there is a demand for the presentation of a technique in which the data can be updated with a simple write algorithm without using the logical address/physical address conversion table.

BRIEF SUMMARY OF THE INVENTION

Embodiments of the present invention may provide a semiconductor storage device and a method of controlling the device in which an efficiency of processing such as rewrite of data can be enhanced with respect to a nonvolatile memory.

According to one aspect of the present invention, there is provided a semiconductor storage device comprising a first nonvolatile memory to store user data of a file; a second nonvolatile memory to store management data of the file, the second nonvolatile memory being different in type from the first nonvolatile memory; and a controller to control read/write of data with respect to the first and second nonvolatile memories.

According to another aspect of the present invention, there is provided a semiconductor storage device comprising a first nonvolatile memory to store data; a second nonvolatile memory to store address conversion information associating a logical address designated on a host side with a physical address on the first nonvolatile memory in which corresponding data is stored, the second nonvolatile memory being different in type from the first nonvolatile memory; and a controller to control read/write of data with respect to the first nonvolatile memory by referring to the address conversion information stored in the second nonvolatile memory.

According to still another aspect of the present invention, there is provided a semiconductor storage device comprising a first nonvolatile memory to store data; a second nonvolatile memory to store new data of a portion to be updated at a time of data update on the first nonvolatile memory and data of a portion not to be updated are temporarily stored, the second nonvolatile memory being different in type from the first nonvolatile memory; and a controller which controls read/write of data with respect to the first and second nonvolatile memories.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram showing a constitution example of a memory card, which is common to first to fourth embodiments of the present invention;

FIG. 2 is a diagram showing an example of another constitution different from that of FIG. 1;

FIG. 3 is a diagram showing an example of another constitution different from that of FIGS. 1 and 2;

FIG. 4 is a diagram showing one example of MCP;

FIG. 5 is an explanatory view of an internal constitution of a NAND type flash memory for use in the constitution examples of FIGS. 1 to 3;

FIG. 9 is a diagram showing one example of format parameters which define allocation of a storage region in the memory card according to the first embodiment of the present invention;

FIG. 13 is a diagram showing one example of a logical address/physical address conversion table prepared on the MRAM according to a second embodiment of the present invention;

FIG. 16 is a diagram showing an extracted part of a storage region of the MRAM and that of the flash memory according to a third embodiment of the present invention;

DETAILED DESCRIPTION OF THE INVENTION

Figure 6:
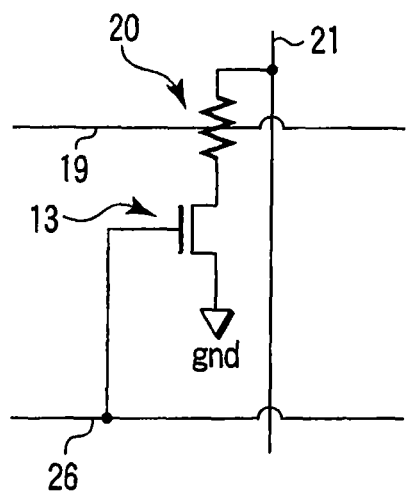
FIG. 6 is an equivalent circuit diagram of MRAM.

Embodiments of the present invention will hereinafter be described with reference to the drawings.

Constitution Common to First to Fourth Embodiments

FIG. 1 is a diagram showing a constitution example of a memory card, which is common to first to fourth embodiments of the present invention. FIG. 2 is a diagram showing an example of another constitution different from that of FIG. 1. FIG. 3 is a diagram showing an example of still another constitution different from that of FIGS. 1 and 2.

Each memory card 10 shown in FIGS. 1 to 3 include common elements such as: a plurality of NAND type flash memories 1, 2 for storing data (user data) of a file main body; a controller 3 for controlling communication with a host side, read/write of data with respect to the flash memories 1, 2, data transfer between various types of memories, and the like; and a CPU 4 for use by the controller 3. Furthermore, each memory card 10 includes one or a plurality of magnetic random access memories (MRAM) 5, but a place of arrangement differs with the constitution example. Moreover, this MRAM differs in application depending on each embodiment.

In the constitution example of FIG. 1, the MRAM 5 is mixed/mounted in the controller 3 in the memory card 10. The mixing/mounting herein includes, needless to say, the mixing/mounting on the same chip, and also includes, for example, the stacking in one package by an assembly technique of the package such as a multi chip package (MCP) shown in FIG. 4. The MRAM is a storage device using a tunneling magneto resistive (TMR) effect to store data. The device also includes characteristics such as non-volatility by which the data is not lost even with disconnection of a power source, a high read/write rate, and high integration. However, there is a problem in cost, and it is difficult to constitute the whole memory card 10 by the MRAM. Therefore, here the MRAM 5 having a relatively small capacity is mixed/mounted in the controller.

In the constitution example of FIG. 2, the MRAM 5 is not mixed/mounted in the controller 3, but the MRAM 5 having a relatively small capacity is mounted in the memory card 10 separately from the flash memories 1, 2 for storing the user data.

In the constitution example of FIG. 3, MRAM 5A, 5B having relatively small capacities are mixed/mounted in the flash memories 1, 2, respectively. Also in this case, each MRAM may also be stacked in one package by the assembly technique of the package as in the multi chip package (MCP) shown in FIG. 4.

Any of the above-described constitution examples is common in that the MRAM having the relatively small capacity is disposed in the memory card 10 separately from the flash memories 1, 2 in which the user data is stored. The memories such as SRAM/DRAM may also collectively be disposed in the memory card separately from the MRAM.

Next, an internal constitution of the NAND type flash memory for use in the constitution examples of FIGS. 1 to 3 will be described with reference to FIG. 5.

For the NAND type flash memory, memory cells which are disposed adjacent to each other and which share a drain and source and which are connected in series with each other are regarded as a basic unit (NAND unit). One end of the series connection is connected to a bit line via a select gate (SD(D)) and the other end thereof is connected to a source line via a select gate (SG(S)). The basic units (NAND units) are integrated in a word line direction to constitute a page as a basic unit of write or read. An aggregate of the pages held between the bit line and source line constitutes a block. In a shown example, 16 pages constitute one block. Data length of one page is 528 bytes. Among these, 512 bytes constitute a user data region, and remaining 16 bytes constitute a redundant portion. The redundant portion is used to store a code for error correction (ECC) with respect to the user data of 512 bytes, a logical address, a flag indicating a status of the block, and the like.

Next, the constitution of the MRAM will be described with reference to FIGS. 6 to 8.

FIG. 6 shows an equivalent circuit diagram of the MRAM. FIG. 7 schematically shows a magnetic tunnel junction (MTJ) device constituting the MRAM.

Figure 7:
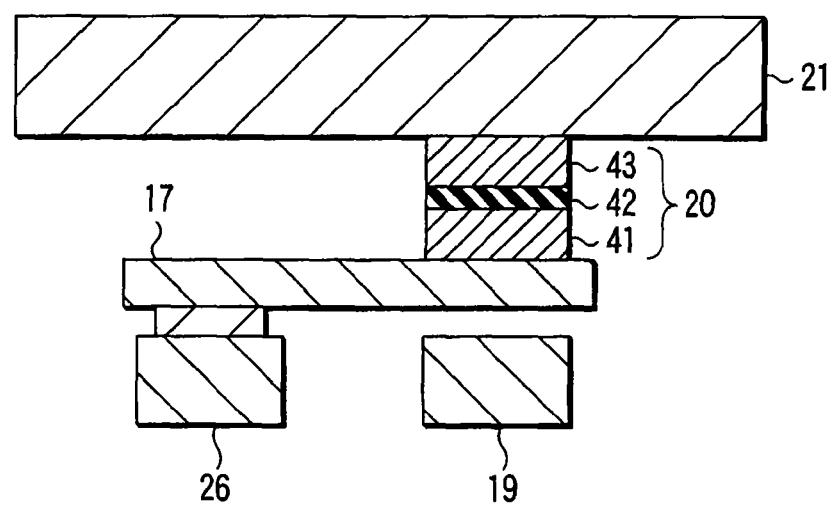
FIG. 7 is a sectional view schematically showing an MTJ device constituting the MRAM.

As shown in FIG. 7, a bit line 21 is disposed so as to cross at right angles to word lines 19, 26, and an MTJ device 20 is disposed in an intersection of the bit line 21 with the write word line 19. One end of the MTJ device 20 is conversion table the bit line 21, and the other end thereof is conversion table a transistor 13. Moreover, a gate electrode of this transistor 13 constitutes the read word line 26.

The MTJ device 20 includes a three-layer structure including two magnetic layers and a non-magnetic layer held between the magnetic layers. That is, as shown in FIG. 7, the MTJ device 20 is constituted of: a magnetization fixed layer 41 connected to a lower electrode 17; a magnetic recording layer 43 connected to the bit line 21 via an upper electrode (not shown); and a thin tunnel junction layer 42 held between the magnetization fixed layer 41 and the magnetic recording layer 43.

Here, the magnetization fixed layer 41 is constituted of an antiferromagnetic layer and ferromagnetic layer. Since magnetization is fixed in one direction, the layer is called a pinned layer. On the other hand, the magnetic recording layer 43 is constituted of the ferromagnetic layer. Since the magnetization direction can freely be changed and information is stored, the layer is called a memory layer. The magnetization direction of the magnetic recording layer 43 can be changed by a synthesized magnetic field formed by a current flowing through the bit line 21 and that flowing through the write word line 19.

Figure 8:
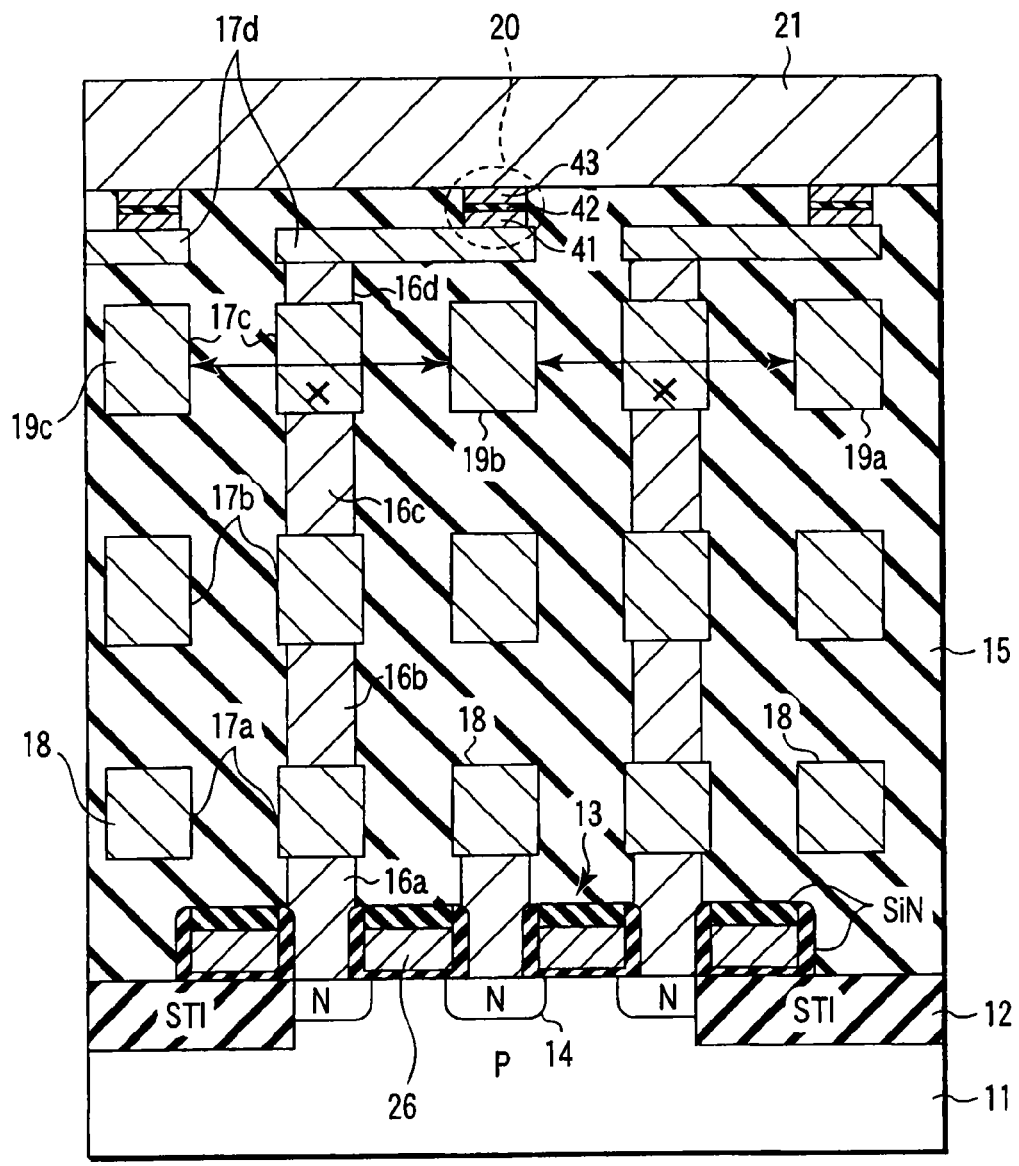
FIG. 8 is a sectional view of the MRAM.

FIG. 8 shows a sectional view of the MRAM. As shown in FIG. 8, for example, in a P-type semiconductor substrate (or a well) 11, a device isolation region 12 including a shallow trench isolation (STI) structure is selectively formed. A MOSFET 13 is selectively formed on the semiconductor substrate 11 and, for example, N-type source/drain regions 14 are formed under opposite ends of the MOSFET 13. Here, a gate electrode of the MOSFET 13 constitutes the read word line 26. Further on the semiconductor substrate 11, first contacts 16*a* connected to the source/drain regions 14 are disposed in an insulating film 15, and first wirings 17*a* are disposed on the first contacts 16*a*. Similarly, in the insulating film 15, second to fourth contacts 16*b*, 16*c*, 16*d* and second to fourth wirings 17*b*, 17*c*, 17*d* are disposed. Here, some of the first wirings 17*a* constitute ground (Gnd) lines 18. Some of the third wirings 17*c* constitute write word lines 19*a*, 19*b*, 19*c*. Moreover, the fourth wirings 17*d* are connected to the MTJ devices 20, and the MTJ devices 20 are connected to the bit line 21.

Next, a write/read operation of data in the MRAM will briefly be described.

First, to write "1", "0" information into the MTJ devices 20, one pair of write word line 19 and bit line 21 are selected. The current is passed through both the selected write word line 19 and bit line 21 to generate current magnetic fields. Accordingly, the magnetic field is applied to a selection cell positioned in an intersection of the write word line 19 and bit line 21, and the information is written exceeding a reverse threshold value of the magnetization of the MTJ devices 20 by the magnetic field.

In this case, for example, when the magnetization direction of the magnetization fixed layer 41 extends in parallel with that of the magnetic recording layer 43, the current is passed through the tunnel junction layer 42. Accordingly, a detected tunnel resistance becomes lowest, and "1" can be stored in this state. On the other hand, when the magnetization direction of the magnetization fixed layer 41 extends in antiparallel with that of the magnetic recording layer 43, the current is passed through the tunnel junction layer 42, the detected tunnel resistance accordingly becomes highest, and "0" can be stored in this state. That is, in the MRAM, a difference between the tunnel resistances is stored as the "1", "0" information.

On the other hand, to read the "1", "0" information written in the MTJ devices 20, when the read word line 26 and bit line 21 are selected, the current flows through the Gnd lines 18 from the bit line 21 via the MTJ devices 20 and MOSFET 13. Moreover, a peripheral circuit reads the difference of the tunnel resistance between the different MTJ devices 20 as the information, and accordingly executes determination of the "1", "0" information.

First Embodiment

In a first embodiment, the MRAM 5 is disposed inside the controller 3, FAT or directory region is stored in the MRAM 5, and a write rate is prevented from dropping with the rewrite by the sector unit such as the rewrite of the FAT and directory generated at the time of file update.

FIG. 9 shows one example of format parameters which define allocation of a storage region in the memory card 10. The information of FIG. 9 is stored in a predetermined region to which the controller 3 can refer. Here, an example in which cluster sizes are 4 KB and 8 KB is shown.

A cluster is a basic minimum unit of file management. Even when a file size is very small, a capacity for one cluster is occupied. When the size of the file is large, the file is managed as a chain of a plurality of clusters, and management information is stored in the file allocation table (FAT). The size of the cluster, a method of managing the FAT, and the like are managed in a sector called a boot sector. When one device is managed as a plurality of drives, the information is stored in a master boot sector.

For the write of the file, a write command is used from OS by a cluster unit.

When the cluster size is 4 KB, the master boot sector is disposed in a logical sector 0, the boot sector is disposed in a logical sector 19, FAT1 (original FAT) is disposed logical sectors 20 to 25, FAT2 (copy of FAT) is disposed in logical sectors 26 to 31, directories are disposed in logical sectors 32 to 47, and a user data region of the file is disposed in a logical sector 48 and subsequent sectors.

When the cluster size is 8 KB, the master boot sector is disposed in the logical sector 0, the boot sector is disposed in the logical sector 25, FAT1 (original FAT) is disposed the logical sectors 26 to 28, FAT2 (copy of FAT) is disposed in the logical sectors 29 to 31, the directories are disposed in the logical sectors 32 to 47, and the user data region of the file is disposed in the logical sector 48 and subsequent sectors.

The format parameters shown in FIG. 9 are described in order of a logical sector address. A host system makes an access based on the logical sector address, and a physical address on the flash memory in the memory card 10 where the data exists in actual depends on control of the controller 3.

In a constitution of prior art, all data of the management data region (logical sectors 0 to 47) and user data region (logical sectors 48 to 63) are allocated to the flash memory. On the other hand, in the constitution of the present embodiment, the user data region of the file (logical sectors 48 to 63) is allocated to the flash memory, whereas the management data region of the file (logical sectors 0 to 47) is allocated to the MRAM 5.

Next, a write process in the memory card 10 of FIG. 1 will be described with reference to FIGS. 10 and 11.

It is to be noted that it is assumed that the management data of the file is stored beforehand on the MRAM 5 in the controller 3 of the memory card 10. Moreover, user data may also be stored beforehand on the flash memories 1, 2, if necessary.

Figure 10:
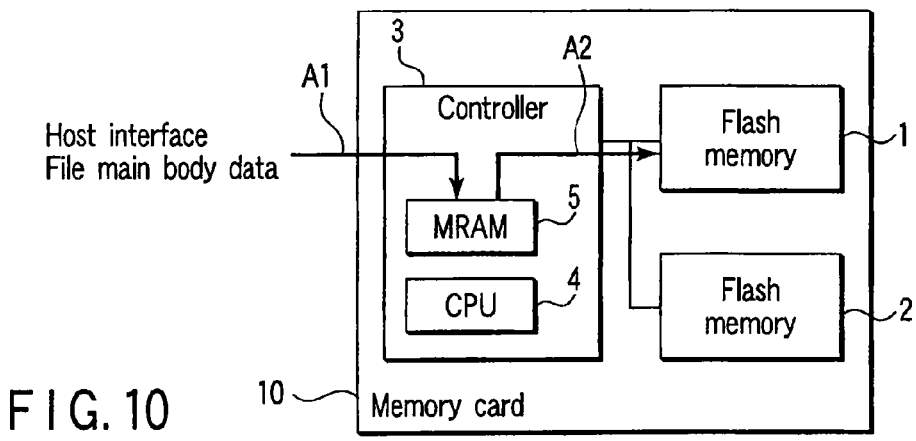
FIG. 10 is a diagram showing a process in a case where there is a request for write of user data of a file.

A case is considered in which a request for write including "data of the file main body" (user data) comes from host through a host interface as shown in FIG. 10. The logical address is designated in the request for write. At this time, the logical address is an address where the data of the file main body is to be stored. Then, the data is written with respect to the flash memory (e.g., the flash memory 1). At this time, the MRAM 5 in the controller 3 functions as a data buffer, and the data from the host is once stored in the MRAM 5 (step A1), and thereafter transferred to the flash memory 1 (step A2).

Figure 11:
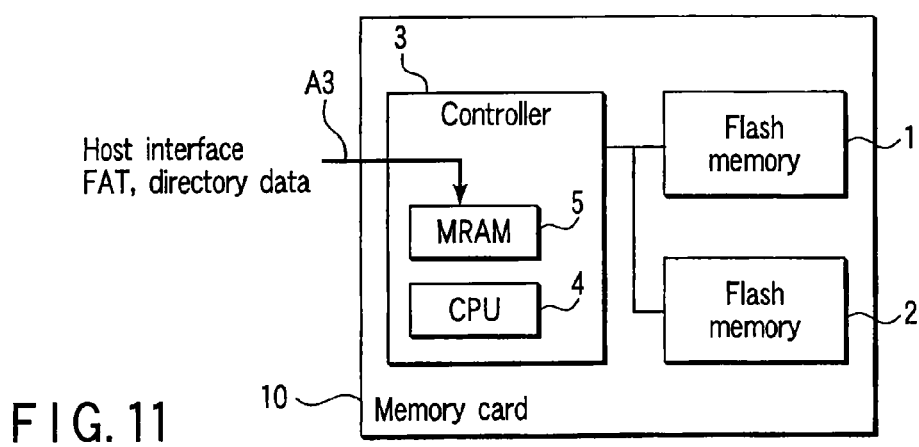
FIG. 11 is a diagram showing a process in a case where there is a request for write of management data of the file.

On the other hand, a case is considered in which the request for write including "FAT, directory data, and the like" (management data of the file) comes from the host through the host interface as shown in FIG. 11. For the logical address, the FAT, directory, and the like correspond to the file management region. In this case, the management data on the MRAM 5 is updated (step A3).

The controller in the conventional memory cell only writes the designated data based on the address designated by the host, and does not identify the data of the user data region or the management data region. On the other hand, the controller 3 in the present embodiment can determine that the designated data is the data of the user data region or the management data region based on the address designated from the host.

Additionally, the logical address in which the management data of the file is stored changes with the parameters of the format (e.g., the capacity, the total number of entries of a root directory, the size of the cluster, and the like). Therefore, in the present embodiment, for example, the following judgment criteria are disposed.

That is, in consideration of the capacity of the MRAM 5 mixed/mounted in the controller 3, and the format parameters that can usually be set, the logical address region for storing the management data of the file is set beforehand, for example, so that the logical addresses 0 to 47 are allocated to the management data region of the file. When the logical address in this range is designated from the host, the controller 3 detects an access to the file management region.

It is to be noted that here the logical address 0 and subsequent logical addresses do not have to be necessarily allocated to the management data region. Usually, a frequency of rewrite of the master boot sector in the logical address 0 is considered to be very small. Moreover, the frequency of the rewrite of the logical addresses between the master boot sector and a partition boot sector is also very small. Therefore, the region of the logical addresses 0 to 15 corresponding to one block of the flash memory may also be excluded from the management data region of the file. In this case, the capacity of the MRAM can be reduced. As a result, it is possible to reduce cost for the MRAM.

Here, a case is considered in which re-formatting is executed in a personal computer (PC), digital camera, and the like and the format parameters are changed. In this case, when a boundary between the management data region and user data region of the file deviates in a direction of a small value of the logical address, a part of the user data is also stored in the MRAM, and there is not any problem.

When the boundary between the management data region and user data region of the file deviates in a direction of a large value of the logical address, a part of the file management data includes a rewrite algorithm similar to that of the usual user data, and an effect of inhibiting performance from being deteriorated is not fulfilled at the maximum. However, it cannot usually be assumed that the parameter is far different from the assumed parameter. Therefore, at least a certain degree of the data of the management data region is stored on the MRAM 5, and an effect of enhancing the performance can be expected. It is to be noted that the controller 3 may also be constituted to decipher the data by itself and to understand the format parameters and to dynamically set a logical address range of the file management region.

Figure 12:
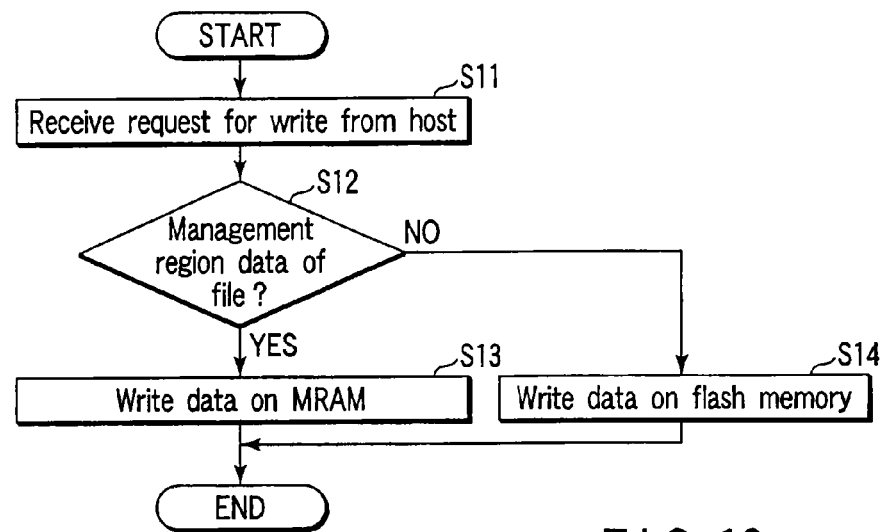
FIG. 12 is a flowchart showing a write operation in the first embodiment.

Next, a write operation in the present embodiment will be described with reference to FIG. 12.

Upon receiving the request for write from the host (step S11), the controller 3 refers to the information of FIG. 9 to confirm the logical address designated by the host, and determines whether the data to be written corresponds to the management data of the file or the user data (step S12). When the data corresponds to the management data of the file, the data is written in the MRAM 5 (step S13). On the other hand, when the data corresponds to the user data (data of the file main body), the data is written in the corresponding flash memory 1 or 2 (step S14).

In this manner, in the first embodiment, the MRAM 5 is disposed in the controller 3, and the FAT or directory region is stored in the MRAM 5, the write rate is prevented from dropping with the rewrite by the sector unit such as the rewrite of the FAT and directory generated at the time of the file update.

Second Embodiment

In a second embodiment, the MRAM 5 is disposed in the controller 3, and a logical address/physical address conversion table (allocation table) in which the logical address designated on the host side is associated with the physical address on the flash memory is stored in the MRAM 5, so that a time for preparing the logical address/physical address conversion table which has heretofore been prepared at the time of power activation is reduced.

FIG. 13 shows one example of the logical address/physical address conversion table prepared on the MRAM 5.

Here, two bytes (one word) are regarded as one unit, and conversion of the logical and physical addresses is managed. For example, offset 0 (i.e., word 0 which is a top word, when the table is prepared from the top of the MRAM region) includes physical address information (high-order address, low-order address) indicating the physical address in which the data of the logical address 0 (i.e., LBA=0) exists. In the present embodiment, an example of the NAND type flash memory whose one block corresponds to 8K bytes is described, and a physical block address is stored in which the data for 16 sectors of the logical sectors 0 to 15 (it is assumed that one sector=512 bytes, and additionally, the size is not limited to 512 bytes) exists.

It is to be noted that when the data corresponding to the logical address does not exist on the flash memory immediately after product shipping or initialization, the corresponding word region is filled with FFh.

Figure 14:
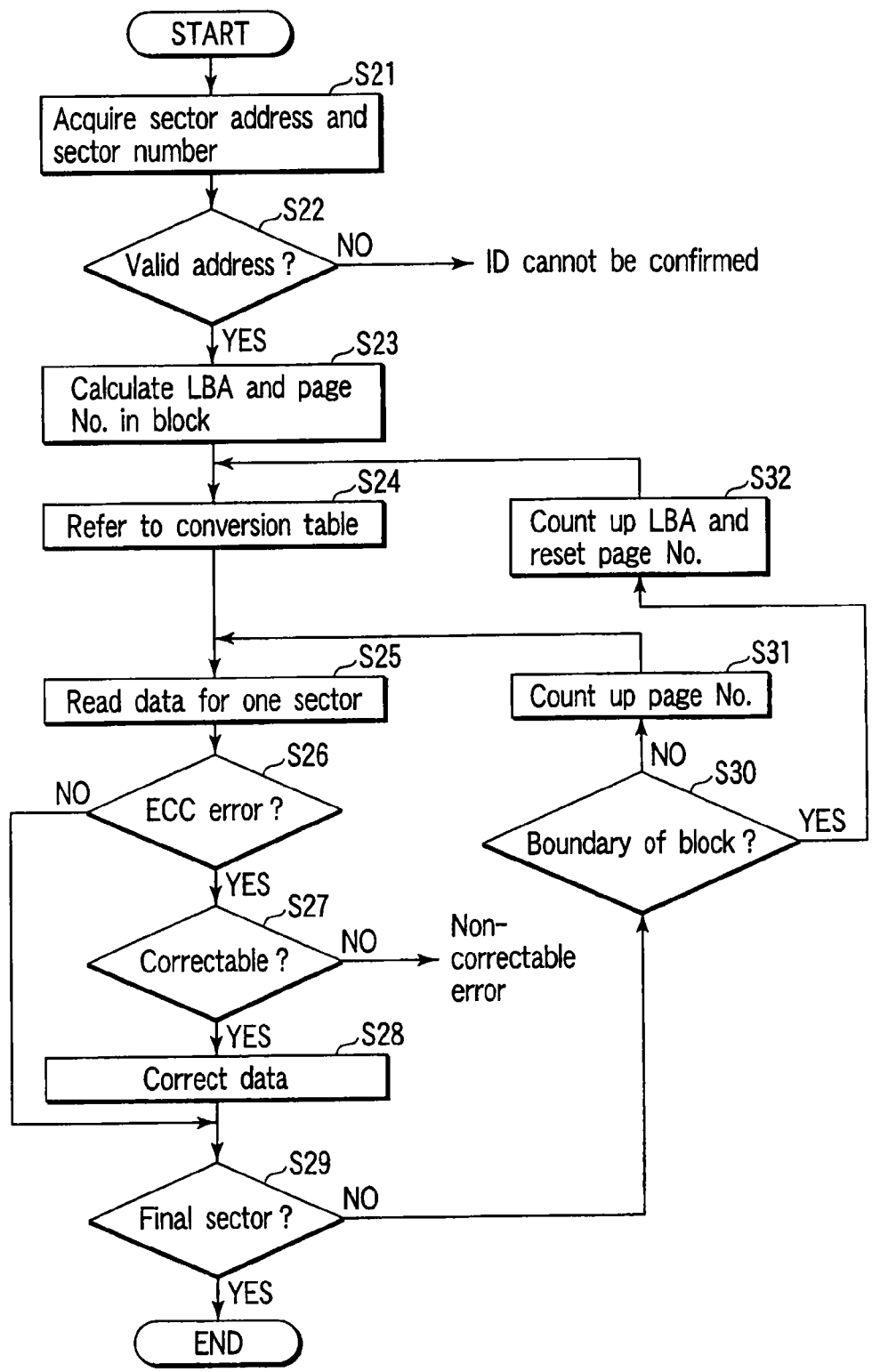
FIG. 14 is a flowchart showing a read operation in the second embodiment.

Next, a read operation in the present embodiment will be described with reference to FIG. 14. This read operation is executed by the controller 3.

In the present embodiment, the logical address/physical address conversion table is present on the MRAM 5. For characteristics, the MRAM is nonvolatile and random accessible. Therefore, different from the prior art, it is not necessary to search for the redundant portions of all the blocks at the time of the power activation or to prepare the logical address/physical address conversion table.

First, a top sector address from which the data is to be read, and the number of transfer sectors are received from the host (step S21), and it is verified whether or not a range is appropriate (step S22). When the range is not appropriate, ID cannot be confirmed. On the other hand, when the range is appropriate, the sector address is converted to the logical block address (logical address), and the number of pages in the block is calculated (step S23). For example, in the present embodiment, since one block is constituted of 16 sectors, the value of each sector address is divided by 16. Moreover, the logical address/physical address conversion table on the MRAM 5 is referred to, and the physical block address in which the corresponding logical block exists is obtained (step S24).

Here, the data for one sector is read from a specified physical block (step S25). For example, when the sector number is 0, the data of the top page of the physical block is read. In one physical block, the data for 16 sectors are arranged in order.

It is checked whether or not there is an error with respect to the read data (step S26). When the error is not detected, the flow advances to step S29. On the other hand, when the error is detected, it is determined whether or not the error is correctable (step S27). The error that is not correctable is processed as the error. On the other hand, when the error is detected, and is further correctable, the data is corrected (step S28).

Here, it is determined whether or not the number of sectors required by the host have been read (final sector has been reached) (step S29). When the final sector is reached, the process is ended. On the other hand, when the final sector is not reached, it is determined whether or not the next read sector exceeds the boundary of the physical block (step S30). At this time, if necessary, the logical address/physical address conversion table is referred to again.

When the boundary is not crossed over, the pages to be read are counted up (step S31), and the read is continued in the same block. On the other hand, when the boundary is crossed over, the physical block address (physical address) is counted up, the count of pages is reset (step S32), and the process shifts that concerning another block.

Next, the write operation in the present embodiment will be described with reference to FIG. 15. The write operation is executed by the controller 3.

It is to be noted that the write process is basically roughly divided into the next three parts. For example, a case in which the logical sector 3 is to be rewritten will be described. In this case, an object of update includes only sector 3. However, since the data for 16 sectors of the sectors 0 to 15 exists on the same block, the process for one block is required.

(1) Regarding logical sectors 0, 1, and 2, there is not any update of the data. Therefore, the data of the logical sectors 0, 1, and 2 needs to be copied to the physical block where the data is to be newly written from the physical block where the data is originally stored.

(2) Since the logical sector 3 is updated, the original data does not have to be copied, and the data supplied from the host is newly written.

(3) For the logical sectors 4 to 15, there is not any update of the data. Therefore, the data of the logical sectors 4 to 15 needs to be copied to the physical block where the data is to be newly written from the physical block where the data is originally stored.

In this manner, a series operation of copying the data with respect to one block, next writing update data, and next copying the data is basically performed. When the data is written into sectors 0 to 15, all the data for one block is updated. Therefore, needless to say, the copy operation is not required.

Figure 15:
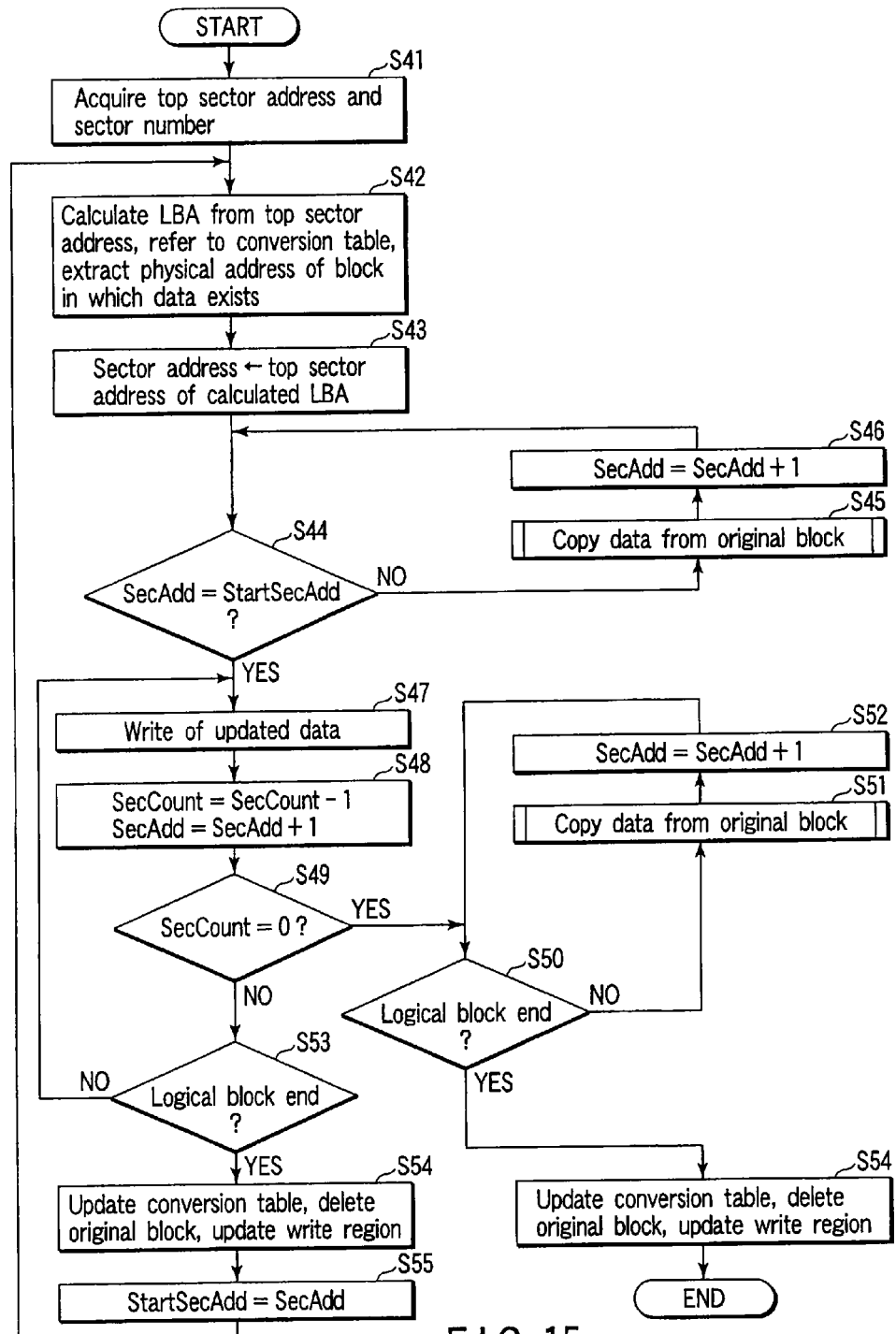
FIG. 15 is a flowchart showing a write operation in the second embodiment.

Each determination section in the flowchart of FIG. 15 corresponds to a process of determining whether the sector to be written is the updated data or the copy operation.

First, the top sector address in which the data is to be updated, and the number of transfer sectors are received from the host (step S41), and a process of converting the sector address to a logical block address (logical address) is performed. That is, the logical block address is calculated from the top sector address, and the physical address of the block in which the data exists is extracted from the logical address/physical address conversion table on the MRAM 5 (step S42). Here, the data to be copied is drawn from the selected block.

The process is started from the top of the physical block corresponding to the top address of the calculated logical block address (step S43). Here, it is determined whether the copy operation is performed with respect to a former half of the block or the data is updated (step S44). In the copy operation, the data is read from the original block and written into the new block (step S45), and the process shifts to that for the next sector (step S46). On the other hand, in the update operation, the data is written based on the update data received from the host (step S47), and the process shifts to that for the next sector (step S48).

It is determined whether or not the data has been written for the number of sectors required by the host (step S49). When the write for the number of required sectors is ended, it is determined whether or not the boundary of the block has been reached (step S50). When the boundary of the block is not reached, a region for the write remains. Therefore, the operation shifts to a copy operation for a latter half of the block. That is, the data is read from the original block and written into the new block (step S51), and the process shifts to that for the next sector (step S52). On the other hand, when the block boundary is reached, the copy operation does not have to be executed any more. Therefore, based on a result of the write, the logical address/physical address conversion table on the MRAM 5 is updated, further the physical block in which the data has originally existed is erased, and a new write region in the next process is registered as a candidate region (step S54), and the process is ended.

When the write for the number of sectors required by the host is not ended in the step S49, it is determined whether or not the boundary of the block has been reached (step S53). When the boundary of the block is not reached, further write is necessary, and therefore the process advances to step S47. On the other hand, when the boundary of the block is reached, the process shifts to that for the next physical block. Before shifting to the next block process, the logical address/physical address conversion table on the MRAM 5 is updated based on the result of the performed write. Furthermore, the physical block in which the original data has existed is erased, and the new write region in the next process is registered as the candidate region (step S54), the process shifts to that for the next block (step S55), and the process advances to step S42.

As described above, the write process is performed with respect to the flash memory. Moreover, at the time of the next power activation, the logical address/physical address conversion table already exists on the MRAM 5. Therefore, different from the prior art, it is not necessary to search for the redundant portions of all the blocks or to prepare the logical address/physical address conversion table.

In the present embodiment, the logical address information is stored in the redundant portions of the NAND type flash memories 1, 2, but the logical address information does not have to be necessarily stored. The logical address/physical address conversion table exists on the MRAM 5, and the logical address/physical address conversion table does not have to be prepared at the time of the power activation as in the prior art. Therefore, unless the logical address of the redundant portion is stored, there is not any problem. Additionally, considering from power cut during the update of the conversion table on the MRAM 5, in an assurance sense, logical address data preferably exists in the redundant portions of the flash memories 1, 2.

Moreover, the flash memory includes a congenitally defective block already unusable in a shipping stage, and an acquired defective block generated by collapse caused in a memory cell during the use, and flags are written in the redundant portions of the flash memory. The information of the defective block may also be stored on the MRAM 5. In this case, even when the data on the flash memory is erased by mistake, the data remains on the MRAM 5. Therefore, the data can be referred to.

Moreover, the table of the erased block may also be stored on the MRAM 5. For example, one bit is allotted to one block. When the bit indicates "1", the erased block is identified. When the bit indicates "0", a block in which the data of a certain logical address is stored is identified. When the table is stored on the MRAM 5, the block in which the data is next to be written can easily be found, and the performance is enhanced.

Moreover, firmware of the controller of the flash memory card may also be stored on the MRAM 5. Usually, the firmware is formed by a mask ROM, but bugs are generated, and a necessity for correction occurs. Considering this, all or a part of the firmware is written beforehand on the MRAM 5. Then, a test command, and the like can be used from the outside to upgrade a version of the firmware.

Moreover, the MRAM 5 is not limited to the storage of the logical address/physical address conversion table, and can also be used as a buffer of the data written from the host or the data read into the host.

As described above, in the second embodiment, the MRAM 5 is disposed in the controller 3, and the logical address/physical address conversion table in which the logical address designated on the host side is associated with the physical address on the flash memory is stored in the MRAM 5. Accordingly, the time for preparing the logical address/physical address conversion table which has heretofore been prepared at the time of the power activation can be reduced.

Third Embodiment

In this third embodiment, the MRAM 5 is disposed in the controller 3, and the MRAM 5 is used as a nonvolatile buffer for holding the data at the time of data update, so that write algorithm is simplified and the logical address/physical address conversion table is not required.

FIG. 16 is a diagram showing an extracted part of a storage region of the MRAM 5 and that of the flash memory 1 (or 2) in the memory card 10 shown in FIGS. 1 to 3. To simplify the description, it is assumed that one block is constituted of four pages (one page is assumed to correspond to one sector, that is, 512 bytes, and in actual there is data for ECC as described above, but the data is not handled here).

As shown, the MRAM 5 includes buffers A, B which are data buffers for exchanging the data mainly with the host, and buffers 0 to 3 which are buffers for saving the data of the flash memory. Each of the buffers A, B, 0, 1, 2, 3 is assumed to be constituted of 512 bytes in the same manner as in the page size of the flash memory (the description of the bytes of ECC is omitted as described above). Moreover, the flash memory includes blocks 1 to 7, and the block 3 is constituted of pages 0 to 3.

Here, one example of the write algorithm executed between the MRAM 5 and flash memory in FIG. 16 will be described with reference to FIGS. 16 and 17 to 20. The process of the write is executed by the controller 3.

Figure 17:
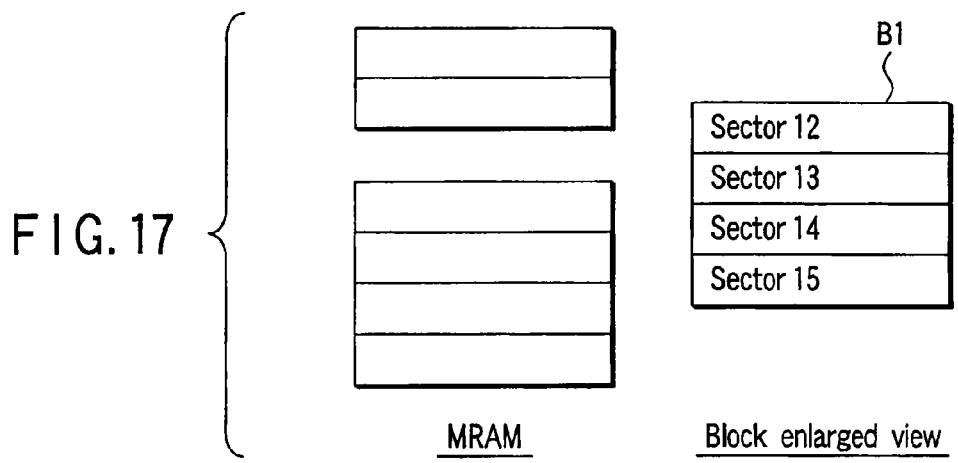
FIG. 17 is a diagram showing an initial state in a write algorithm.

FIG. 17 shows an initial state. In this state, the data of logical sector 12 is stored in page 0 of block 3 of the flash memory shown in FIG. 16, the data of logical sector 13 is stored in page 1, the data of logical sector 14 is stored in page 2, and the data of logical sector 15 is stored in page 3, respectively (step B1).

Figure 18:
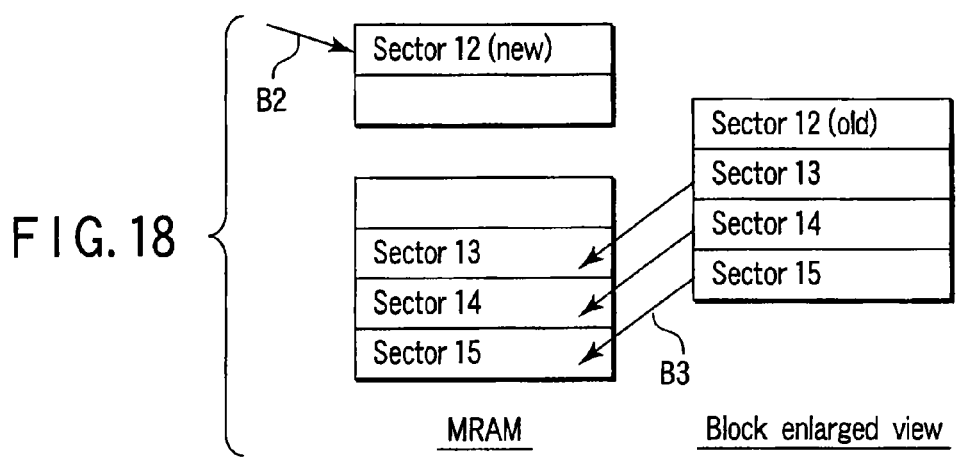
FIG. 18 is a diagram showing a temporary storage process in the write algorithm.

FIG. 18 shows a temporary storage process on the side of the MRAM 5 at a time when a request for update of the data is generated with respect to the sector 12. New data of the logical sector 12 transferred from the host at the time of the request for update of the data is first once recorded in a predetermined region (buffer A) of the MRAM 5 in the memory card 10 (step B2). Next, for the data stored in the block 3, the data of sectors 13, 14, 15 that does not have to be updated is transferred to the MRAM 5 (step B3).

Figure 19:
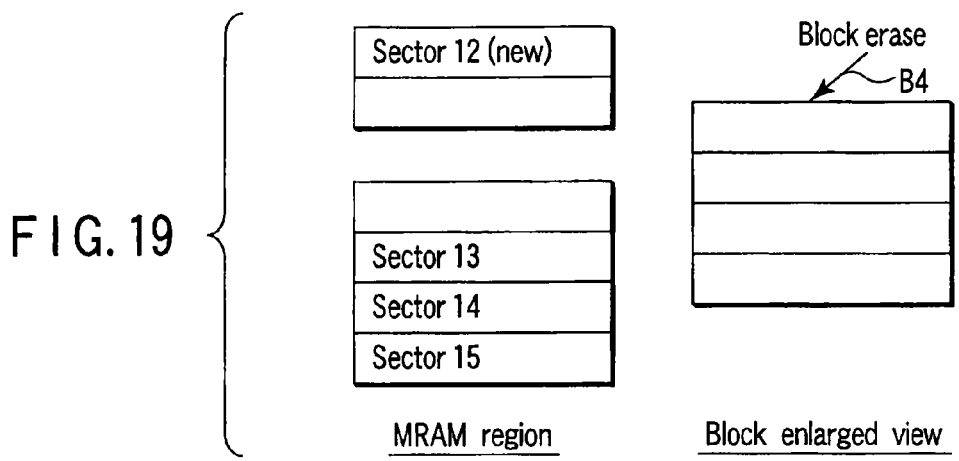
FIG. 19 is a diagram showing a block erase process in the write algorithm.

FIG. 19 shows a block erase process on the side of the flash memory. When the temporary storage process on the MRAM 5 side is completed, the block 3 is erased (step B4).

Figure 20:
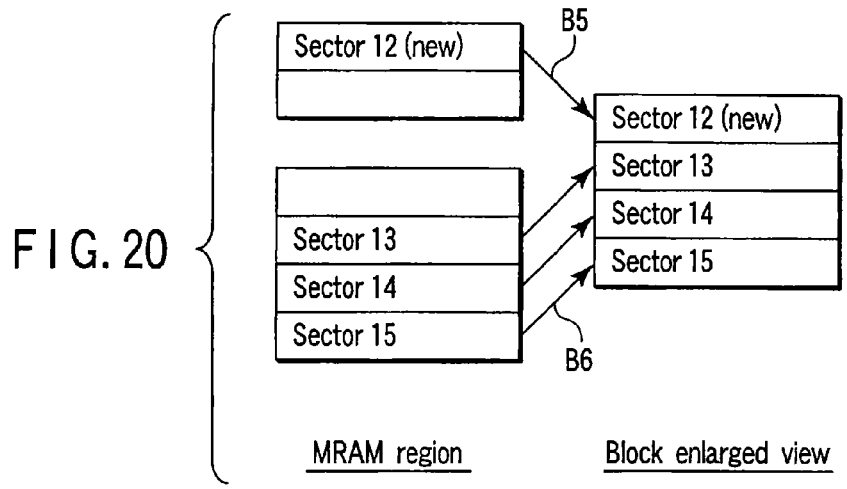
FIG. 20 is a diagram showing a data transfer process in the write algorithm.

FIG. 20 shows a data transfer process into the flash memory from the MRAM 5. When the block erase process is completed on the flash memory side, with respect to the erased block 3, the data for update of sector 13 on the MRAM 5 is transferred to the page 0 of the block 3 from the buffer A (step B5). The data of the remaining logical sectors is written back onto the block physical block address of the flash memory from the MRAM 5 (step B6). Accordingly, the data update of the sector 12 is completed.

In the prior art, when the power supply is cut in the midst of the update process, the data disappears. However, according to the present embodiment, since the necessary data remains on the MRAM 5, it is possible to restore the data. Moreover, the block in which the data has originally existed is erased to update the data. Therefore, a relation between the logical address and physical address is a fixed relation, and it is not necessary to prepare the logical address/physical address conversion table. Therefore, the time for preparing the logical address/physical address conversion table at the time of the power activation is saved, and a high-rate start can be realized.

Moreover, as a method of determining whether or not the power supply has been cut during the write, the following method is considered.

A specific region of the MRAM 5 is defined as a write end flag region. For example, when the process shown in FIG. 18 ends, the flag of the region is set to "1". The flag is cancelled at the time of completion of the process shown in FIG. 20. That is, the flag is set to "0".

If the power supply is cut in a stage of FIG. 19, and again activated, the flag remains to be "1". It is seen that the power supply is cut during the write operation. Therefore, in this case, the data existing on the MRAM 5 is used to continue and end the incomplete process. Needless to say, when the process is completed, the flag is naturally reset at "0". Moreover, the erase operation of the flash memory is grasped alone, and the flag is set before entering the erase operation, and is reset at the time of the end of the erase operation. Such flag for the erase operation may also be set.

Moreover, in FIGS. 16 to 20, for ease of description, the buffer for use in exchanging the data with the host is described separately from the buffer for use in saving the data of the flash memory, but may also be constituted in common. For example, when a region having the same size as that of one block of the flash memory is set on the MRAM 5, it is possible to store both the data to be updated and the data to be held.

Furthermore, in the description of FIGS. 16 to 20, as the unit of the write, 512 bytes have basically be described. However, in recent years, with enlargement of the capacity of the flash memory, the unit of the write of the NAND type flash memory is not limited to 512 bytes, and products having write units, for example, of 1, 2, and 4 Kbytes (in actual the capacity of each ECC code region is added) have been mass-produced.

It is clear that the present invention can be applied for these. In this case, the buffer size of the MRAM is adjusted to an optimum value in accordance with the page size or block size of the flash memory.

Moreover, a sequence for receiving the write data in the MRAM 5 from the host may also be executed simultaneously with the data transfer between the flash memory and MRAM 5.

In this manner, in the third embodiment, the MRAM 5 is disposed in the controller 3, and the MRAM 5 is used as the nonvolatile buffer for holding the data at the time of the data update. Accordingly, the write algorithm can be simplified, and the necessity of the logical address/physical address conversion table can be obviated.

Fourth Embodiment

This fourth embodiment can appropriately be combined and implemented with the respective constitutions described in the first to third embodiments.

In general, in the MRAM, a write current is large at the time of the write of the information into the existing memory cell. That is, to store the information in the memory cell, by current magnetic fields produced by the word and bit lines, the magnetization direction of the memory cell is reversed. At this time, a large current is required. For example, when the word line or bit line is constituted of copper or aluminum, a current of about 10 mA is required per memory cell. A value is close to a disconnection limit value by electron migration. When the information is simultaneously written in a plurality of memory cells, the power consumption of the whole system remarkably increases. Moreover, when a coercive force of the memory cell is reduced, the write current can be reduced, but by a magnetic influence from the outside, the magnetization direction of the memory cell is reversed, and there is also possibility that reliability of the memory cell is impaired. In this fourth embodiment, these problems are solved.

Figure 21:
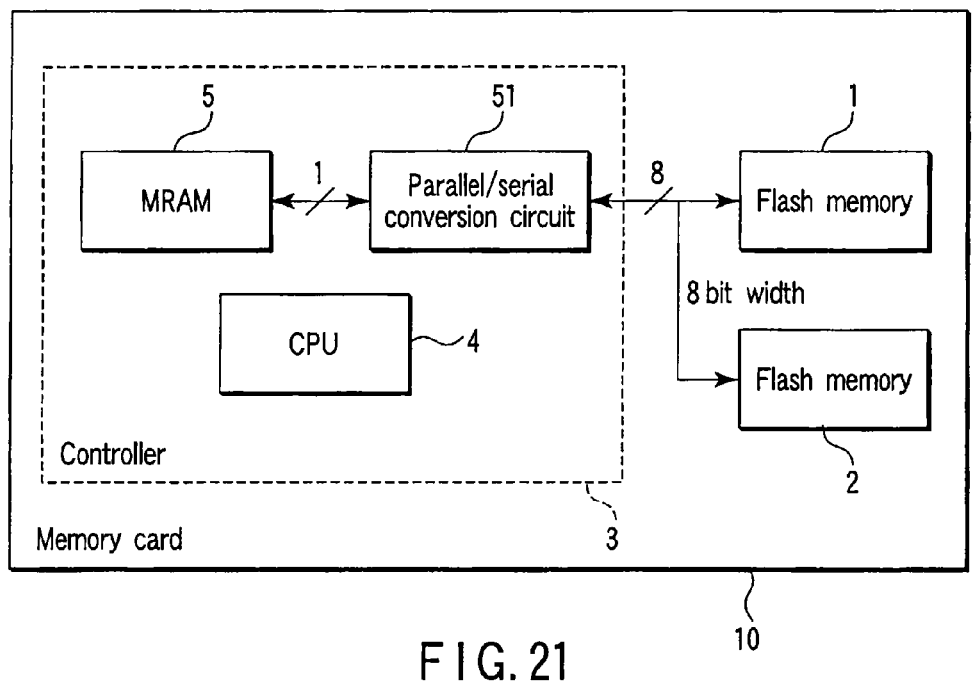
FIG. 21 is a diagram showing a constitution example of the memory card in which a peak value of a current at the time of the write of the data into the MRAM is reduced.

FIG. 21 shows a constitution example of the memory card in which a peak value of the current at the time of the write of the data into the MRAM 5 is reduced.

In this constitution example, at the time of the write of the data into the MRAM 5, a bit width is limited, for example, to one bit. For example, for the flash memories 1, 2, the data is inputted/outputted with an eight-bit width, whereas the data is written into the MRAM 5 with one bit width. For example, as shown, a parallel/serial conversion circuit 51 is disposed between the flash memories 1, 2 and the MRAM 5. In this case, when the data is transferred into the MRAM 5 from the flash memories 1, 2, the parallel/serial conversion circuit 51 parallel/serial converts the data. Moreover, the data is written into the MRAM 5 with a bit width smaller than that of the data outputted from the flash memories 1, 2. Since the write into the MRAM 5 is executed, for example, every bit, it is possible to suppress the peak value of the current.

It is to be noted that the bit widths of the flash memories 1, 2 and MRAM 5 are not limited to the above-described values. The bit width in the MRAM 5 may also be changed, for example, to two bits or four bits. The bit widths of the flash memories 1, 2 may also be set, for example, to 16 bits. In this case, from a relation with the bit widths of the flash memories 1, 2, the write unit into the MRAM 5 may also be set to eight bits. That is, when the data is written into the MRAM 5 in a time division manner, and the peak value of the write current is suppressed, the effect can be expected.

Moreover, the constitution or disposing place of the parallel/serial conversion circuit 51 may be changed. For example, the MRAM 5 is mounted in the controller 3 in some case, and is mounted as a separate chip outside the controller 3 in the other case. Similarly, the parallel/serial conversion circuit 51 is also mounted in the controller 3, disposed between the controller 3 and external MRAM 5 (see FIG. 2), or mounted inside an MRAM chip itself, or the flash memory itself includes a mode of a serial output. Various cases are allowed. When the data is written into the MRAM 5 with a value smaller than the bit widths of the flash memories 1, 2, the scope of the present embodiment is satisfied.

Moreover, as a method of reducing the power consumption of the whole system, there is the following method.

Figure 22:
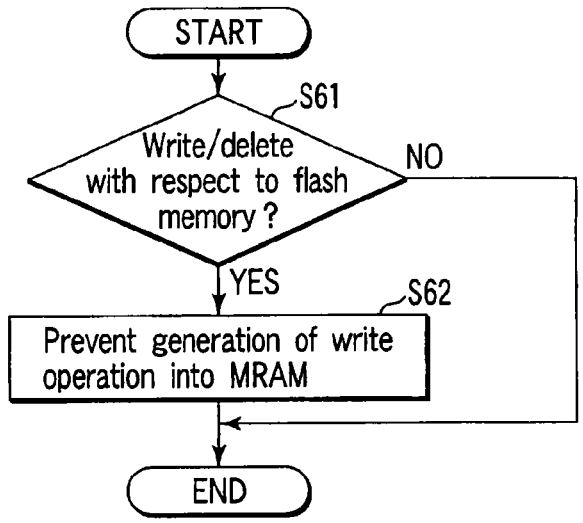
FIG. 22 is a flowchart showing a method of reducing power consumption of the whole system.

For the flash memory, especially the NAND type flash memory, at the time of the write and erase, a booster circuit for producing a high voltage (about 20 V) is activated, and the power consumption increases. Therefore, as shown in FIG. 22, at the time of the write and erase of the flash memories 1, 2 (when the booster circuit is activated), the controller 3 executes a control so as to prevent the data from being written into the MRAM 5 (steps S61, S62). Then, the booster circuits in the flash memories 1, 2 are not activated simultaneously with the write into the MRAM, and the power consumption of the whole system is reduced. The write and erase may be defined as "the time of operation of the booster circuit in the flash memory". In specifications in which the write and erase are notified to the outside by a ready/busy signal, a "busy state of the flash memory" may also be defined.

Moreover, as the method of reducing the power consumption of the whole system, there is also the following method.

Figure 23:
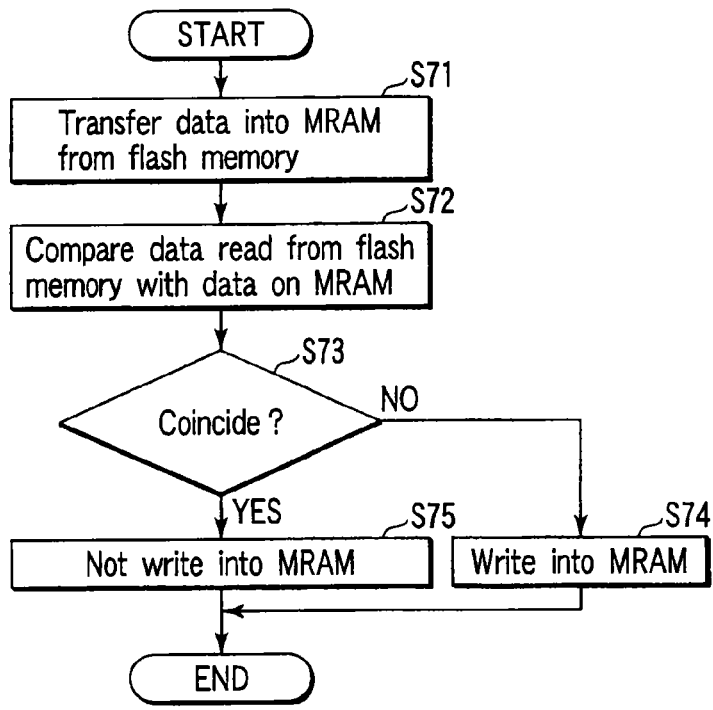
FIG. 23 is a flowchart showing another method of reducing the power consumption of the whole system.

For example, as shown in FIG. 23, when the data is transferred to the MRAM 5 from the flash memories 1, 2 (step S71), the controller 3 compares the data to be written into the MRAM 5 (the data read from the flash memories 1, 2) with the data held by the MRAM 5 (step S72). When the data is not the same, the data is written as usual (steps S73, S74). However, the same data is controlled not to be written (steps S73, S75).

For example, when the data to be written is "1", the data of a write object memory cell of the MRAM 5 is read in advance. When the data is "1", the data is not written.

If the data is "0", "1" is written. Accordingly, in a simple probability calculation, the number of write operations can be reduced to ½, the power consumption of the system can be reduced, and this is useful in consideration of the use of a portable information terminal.

Additionally, there is also the following method of reducing the power consumption of the whole system.

For example, the write data is managed by a predetermined unit as follows. For simplicity of the description, an example in which the data is managed by a unit of eight bits will be described. Here, a reverse flag of one bit is allotted to the write data of eight bits. For example, it is assumed that the write data is "1111 1111". In this case, when the data held in the MRAM 5 is "0000 0000", eight bits have to be originally written, but here instead of writing eight bits, the reverse flag is set to "1". When the data is read from the MRAM 5, and the reverse flag is set to "1", the reverse data of the held data is assumed as correct data. In this example, the read data is "0000 0000", but the reverse flag is "1", and therefore the data itself is reversed to "1111 1111". In actual, it is preferable to compare arbitrary write data with the bit of the data held in the MRAM 5 and to determine whether or not to use the reverse flag. For example, when the data in the MRAM 5 is "1111 1111", and the write data is "1111 0011", only the bit to write "0" is written. When the data in the MRAM 5 is "1111 1111", and the write data is "0000 1100", only the bit to write "1" is rewritten to "0", and further the reverse flag is written. Accordingly, actually written data is "1111 0011", but is reversed by the reverse flag, and "0000 1100" is correctly recognized. As described above, the number of bits to be written into the MRAM 5 is reduced, and the power consumption of the whole system is reduced.

Moreover, from a viewpoint of enhancement of reliability, the may be disposed means for alleviating the influence from the external magnetic field. For example, with the memory card, a material having a magnetically shielding effect may be used in a frame, a housing, or a label attached to the surface of the card so as to prevent the magnetization direction of the memory cell from being reversed by the magnetic influence from the outside of the MRAM 5 or to prevent reliability of the memory cell from being impaired.

Moreover, a technique of error correction may also be used to secure the reliability. For example, at the time of the write of the data into the MRAM 5, a code for error correction is produced by a predetermined unit, and the data is held together with the code in the MRAM 5. Examples of the method of error correction include a general read/Solomon code, BCH code, humming code, and the like. When the parallel/serial conversion circuit is disposed as described above, the BCH code is easily handled. A method of determining only presence/absence of the error by a cyclic redundancy check (CRC) may also be used.

In this manner, in the fourth embodiment, various types of methods are introduced to save the power consumption and to enhance the reliability in the use of the MRAM 5. It is to be noted that the above-described solution proposals of the various problems of the MRAM 5 may be carried out alone or as a combination of a plurality of proposals.

In the above-described embodiments, a case where the MRAM is mounted has been described, but the embodiments are not necessarily limited to the MRAM. For example, a ferroelectric random access memory (FeRAM) using a ferroelectric material, or an ovonics unified memory (OUM) using chalcogen compounds may also be used. Any storage device has no problem as long as the write with a small size is possible as compared with the NAND type flash memory (a device including a random access function is preferably usable also as the buffer) and conditions of non-volatility and no limitation on the number of write operations are satisfied.

Moreover, for the same flash memory, when at least two or more types of flash memories different in specifications are mounted, it is also possible to carry out the present invention in a range in which there is no practical problem. Moreover, the flash memory for use is not limited to the NAND type flash memory. Various types of flash memories can be applied such as a NOR type, AND type, and DINOR type.

As described above in detail, according to the present invention, it is possible to enhance efficiencies of processes such as data update with respect to a nonvolatile memory in a semiconductor storage device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system configured to be coupled to a host, the memory system comprising:
a nonvolatile semiconductor flash memory comprising a plurality of blocks, each of the blocks being a unit for erasure of data, each of the blocks comprising a plurality of pages, each of the pages comprising a plurality of first memory cells;
a nonvolatile semiconductor random access memory having a plurality of second memory cells, a memory capacity of the random access memory being smaller than a memory capacity of the flash memory; and
a controller configured to receive first data and a request for writing the first data from the host, the controller being configured to perform in response to the request:
receiving the first data from the host and writing the first data to the random access memory,
copying second data stored in the flash memory to the random access memory, and
copying the first and second data stored in the random access memory to the flash memory, wherein:
a plurality of logical sector addresses are assigned to a storage region of the memory system, the memory system is configured to store management information and file data, the management information indicates which ones of the logical sector addresses are allocated to store the file data, and the management information is accessible from the host;
the first and second data are associated with consecutive addresses which are included in the logical sector addresses, and
the controller is configured to receive third data from the host simultaneously with the copying the first and second data stored in the random access memory.

2. A memory system according to claim 1, wherein in a case where a power supply to the memory system has been stopped after writing the first data to the random access memory and copying the second data to the random access memory and before copying the first and second data stored in the random access memory to the flash memory, after the power supply to the memory system is restarted, the controller copies the first and second data stored in the random access memory to the flash memory.

3. The memory system according to claim 2, wherein the controller uses information indicating whether or not a write operation, in which the first and second data stored in the random access memory are copied to the flash memory, has been completed.

4. The memory system according to claim 1, wherein a material having a magnetically shielding effect is used in at least part of the memory system.

5. The memory system according to claim 1, wherein the nonvolatile semiconductor random access memory is an MRAM, and the nonvolatile semiconductor flash memory is a NAND type flash memory.

6. The memory system according to claim 5, wherein the MRAM is stacked on a controller chip.

7. The memory system according to claim 6, wherein the MRAM is stacked on the controller chip in one package.

8. The memory system according to claim 5, wherein the MRAM is stacked on a memory chip.

9. The memory system according to claim 8, wherein the MRAM is stacked on the memory chip in one package.

10. The memory system according to claim 1, wherein:
a plurality of clusters are assigned to the storage region of the memory system and the clusters are arranged in an order of the logical sector addresses; and
the management information indicates which one or more of the clusters are allocated to store the file data.

11. The memory system according to claim 10, wherein the management information includes a file allocation table.

12. A memory system configured to be coupled to a host, the memory system comprising:
a first nonvolatile memory;
a second nonvolatile memory, a memory capacity of the second nonvolatile memory being smaller than a memory capacity of the first nonvolatile memory, the second nonvolatile memory being a different type of memory than the first nonvolatile memory; and
a controller configured to receive first data and a request for writing the first data from the host, the controller being configured to perform in response to the request:
receiving the first data from the host and writing the first data to the second nonvolatile memory,
copying second data stored in the first nonvolatile memory to the second nonvolatile memory, and
copying the first and second data stored in the second nonvolatile memory to the first nonvolatile memory, wherein:
a plurality of logical sector addresses are assigned to a storage region of the memory system, the memory system is configured to store management information and file data, the management information indicates which ones of the logical sector addresses are allocated to store the file data, and the management information is accessible from the host;
the first and second data are associated with consecutive addresses which are included in the logical sector addresses, and
the controller is configured to receive third data from the host simultaneously with the copying the first and second data stored in the second nonvolatile memory.

13. A memory system according to claim 12, wherein in a case where a power supply to the memory system has been stopped after writing the first data to the second nonvolatile memory and copying the second data to the second nonvolatile memory and before copying the first and second data stored in the second nonvolatile memory to the first nonvolatile memory, after the power supply to the memory system is restarted, the controller copies the first and second data stored in the second nonvolatile memory to the first nonvolatile memory.

14. The memory system according to claim 13, wherein the controller uses information indicating whether or not a write operation, in which the first and second data stored in the second nonvolatile memory are copied to the first nonvolatile memory, has been completed.

15. The memory system according to claim 12, wherein a material having a magnetically shielding effect is used in at least part of the memory system.

16. The memory system according to claim 12, wherein the second nonvolatile memory is stacked on a controller chip.

17. The memory system according to claim 16, wherein the second nonvolatile memory is stacked on the controller chip in one package.

18. The memory system according to claim 12, wherein the second nonvolatile memory is stacked on a memory chip.

19. The memory system according to claim 18, wherein the second nonvolatile memory is stacked on the memory chip in one package.

20. The memory system according to claim 12, wherein:
a plurality of clusters are assigned to the storage region of the memory system and the clusters are arranged in an order of the logical sector addresses; and
the management information indicates which one or more of the clusters are allocated to store the file data.

21. The memory system according to claim 20, wherein the management information includes a file allocation table.

* * * * *